(12) United States Patent
Yang

(10) Patent No.: US 7,459,970 B2
(45) Date of Patent: Dec. 2, 2008

(54) METHOD AND APPARATUS FOR OPTIMIZING POWER DISSIPATION IN A LOW NOISE AMPLIFIER

(75) Inventor: Neng-Tze Yang, Hermosa Beach, CA (US)

(73) Assignee: SiRF Technology, Inc., San Jose, CA (US)

( * ) Notice: Subject to any disclaimer, the term of this patent is extended or adjusted under 35 U.S.C. 154(b) by 8 days.

(21) Appl. No.: 11/622,424

(22) Filed: Jan. 11, 2007

(65) Prior Publication Data

US 2008/0211579 A1 Sep. 4, 2008

Related U.S. Application Data

(60) Provisional application No. 60/758,247, filed on Jan. 11, 2006.

(51) Int. Cl.
*H03F 1/14* (2006.01)
(52) U.S. Cl. .......................................... 330/51; 330/310
(58) Field of Classification Search .................. 330/51, 330/98, 150, 310
See application file for complete search history.

(56) References Cited

U.S. PATENT DOCUMENTS

| 5,012,244 | A | * | 4/1991 | Wellard et al. | ............... 341/143 |
| 5,289,420 | A | * | 2/1994 | Neu | ............................ 365/203 |
| 6,111,606 | A | * | 8/2000 | Ikeda | ......................... 348/241 |
| 6,411,892 | B1 | | 6/2002 | van Diggelen | |
| 6,417,801 | B1 | | 7/2002 | van Diggelen | |
| 6,429,814 | B1 | | 8/2002 | van Diggelen et al. | |
| 6,453,237 | B1 | | 9/2002 | Fuchs et al. | |
| 6,484,097 | B2 | | 11/2002 | Fuchs et al. | |
| 6,487,499 | B1 | | 11/2002 | Fuchs et al. | |
| 6,510,387 | B2 | | 1/2003 | Fuchs et al. | |
| 6,542,820 | B2 | | 4/2003 | LaMance et al. | |
| 6,560,534 | B2 | | 5/2003 | Abraham et al. | |
| 6,606,346 | B2 | | 8/2003 | Abraham et al. | |
| 6,677,735 | B2 | * | 1/2004 | Xi | ............................... 323/273 |
| 6,704,651 | B2 | | 3/2004 | van Diggelen | |
| 7,173,460 | B2 | * | 2/2007 | Jaussi et al. | .................. 327/149 |

* cited by examiner

*Primary Examiner*—Henry K Choe
(74) *Attorney, Agent, or Firm*—Thomas, Kayden, Horstemeyer & Risley, LLP

(57) ABSTRACT

A method and a low noise amplifier are provided such that the low noise amplifier has a power dissipation that is adaptive to the noise interference levels. The low noise amplifer includes (i) first, second and third differential amplifiers connected in series each having a terminal for receiving a power supply current; and (ii) first and second switches responsive to a control signal, the first and second switches configured such that, (a) when the control signal is in a first state, the first switch and the second switch enable independent currents to flow in the terminals for receiving a power supply current; and (b) otherwise, the first switch and the second switch enable the terminal for receiving a power supply current of the second differential amplifier to reuse a current provided to the terminal for receiving a power supply current of the third differential amplifier. The control signal is provided by a radio frequency noise power detector, which senses an output signal of the low noise amplifier.

8 Claims, 2 Drawing Sheets

METHOD AND APPARATUS FOR OPTIMIZING POWER DISSIPATION IN A LOW NOISE AMPLIFIER

CROSS-REFERENCE TO RELATED APPLICATIONS

The present application is related to, and claims benefit of priority of, U.S. provisional patent application, entitled "Methods and Apparatus for Optimizing Power Dissipation in a Low Noise Amplifier," Ser. No. 60/758,247, filed on Jan. 11, 2006. The copending provisional patent application is hereby incorporated by reference in its entirety.

BACKGROUND OF THE INVENTION

1. Field of the Invention

The present invention relates to power dissipation reduction in a low noise amplifier (LNA) of a receiver.

2. Discussion of the Related Art

Low noise amplifiers (LNAs) are common components of receivers used in communication systems. For an LNAs with a fixed supply voltage, a conventional method for reducing power dissipation re-uses the currents in the LNA's stages (i.e., staging one stage on top of another stage). Because the currents are reused, the total DC power dissipation by the amplifier is reduced. In some cases, however, such power dissipation schemes are not acceptable; designers are then forced to "over-design" the LNA, requiring a higher, fixed DC power dissipation. In the detailed description below, the terms "P1 dB" and "IP3" are used. "P1 dB" or "1 dB compression point," refers to a figure-of-merit used in amplifier design which indicates the power level that causes the gain to drop by 1 dB from its small signal value. A higher P1 dB indicates a higher power. IP3, or the third order intercept point, is a figure-of-merit for an amplifier's linearity or distortion. A higher IP3 value indicates greater linearity and less distortion.

The prior art fails to operate correctly when strong interference is present and dissipates higher DC power than required.

SUMMARY

A method and a low noise amplifier are provided such that the low noise amplifier has a power dissipation that is adaptive to the noise interference levels. The low noise amplifier includes (i) first, second and third differential amplifiers connected in series each having a terminal for receiving a power supply current; and (ii) first and second switches responsive to a control signal, the first and second switches configured such that, (a) when the control signal is in a first state, the first switch and the second switch enable independent currents to flow in the terminals for receiving a power supply current; and (b) otherwise, the first switch and the second switch enable the terminal for receiving a power supply current of the second differential amplifier to reuse a current provided to the terminal for receiving a power supply current of the third differential amplifier. The control signal is provided by a radio frequency noise power detector, which senses an output signal of the low noise amplifier.

In one embodiment, the low noise amplifier includes a mixer that filters the output signal. In another embodiment, the low noise amplifier includes a baseband filter that filters the output signal.

The present invention is better understood upon consideration of the detailed description below and the accompanying drawings.

DETAILED DESCRIPTION

The present invention provides a method and an apparatus for reducing power dissipation in a low noise amplifier (LNA) whenever interference signals are weak, using an adaptive DC power control to reduce DC power dissipation for an LNA. The adaptive DC power control both re-uses currents and reduces current, and hence uses a higher DC power only when needed. In one embodiment, the present adaptive power optimization scheme reduces DC power dissipation in an LNA by more than 3.6 times (e.g., from 35 mW to 9.7 mW) relative to the prior art.

Figure 1:
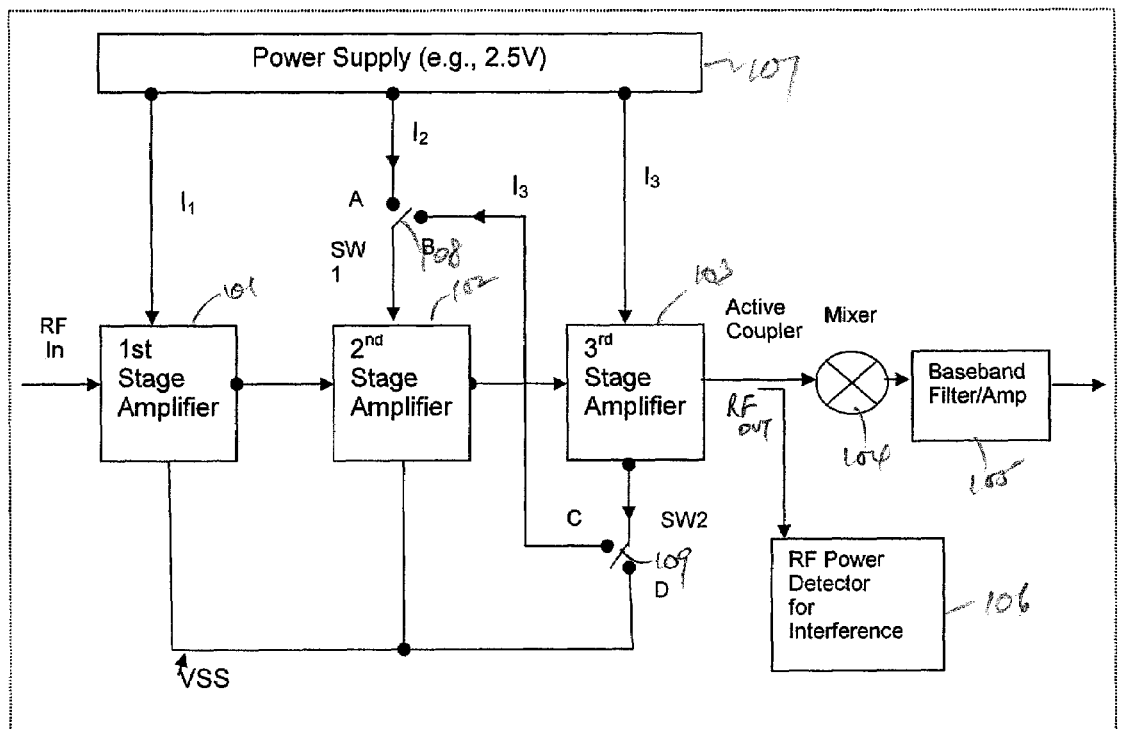
FIG. 1 shows three-stage LNA 100, in accordance with one embodiment of the present invention.

FIG. 1 shows three-stage LNA 100, in accordance with one embodiment of the present invention. As shown in FIG. 1, stages 101, 102 and 103 are connected in series, with an input signal $RF_{IN}$ applied as an input terminal of stage 101. Output signal $RF_{OUT}$ from stage 103 is applied as an input signal to mixer 104, which is applied as an input signal to a baseband filter or amplifier 105. Stages 101, 102 and 103 each receive power from common power supply 107. Stage 101 is powered through a current path $I_1$, stage 102 is powered through a current path $I_2$ (through switch 108, when switch 108 is closed) or, alternatively, through a common current path $I_3$ it shares with stage 103, when switch 109 is closed. When switch 109 is closed, current $I_3$ in stage 103 is reused in stage 102.

The present invention adjusts DC the power dissipation of LNA 100, in accordance with the desired values of input P1 dB and IP3 without degrading the noise rejection characteristics of LNA 100. The adjacent channel and alternative adjacent channel interference levels may be monitored in LNA 100 by on-chip RF power detector 106, which detects the noise in signal $RF_{OUT}$ upstream from baseband filter or amplifier 105, as shown in FIG. 1. When the detected noise level is below a threshold, switch 109 is closed and switch 108 is opened, so that current $I_3$ is reused between stages 102 and 103. Otherwise, switch 109 is open and switch 108 is closed, so that currents $I_2$ and $I_3$ flow in stages 102 and 103, respectively. Under this arrangement, DC power is conserved when interference is weak, and a higher DC power is used when necessary (e.g., when the interference is strong) in order to maintain the minimum SINAD required for LNA 100 to operate properly.[1]

Figure 2:
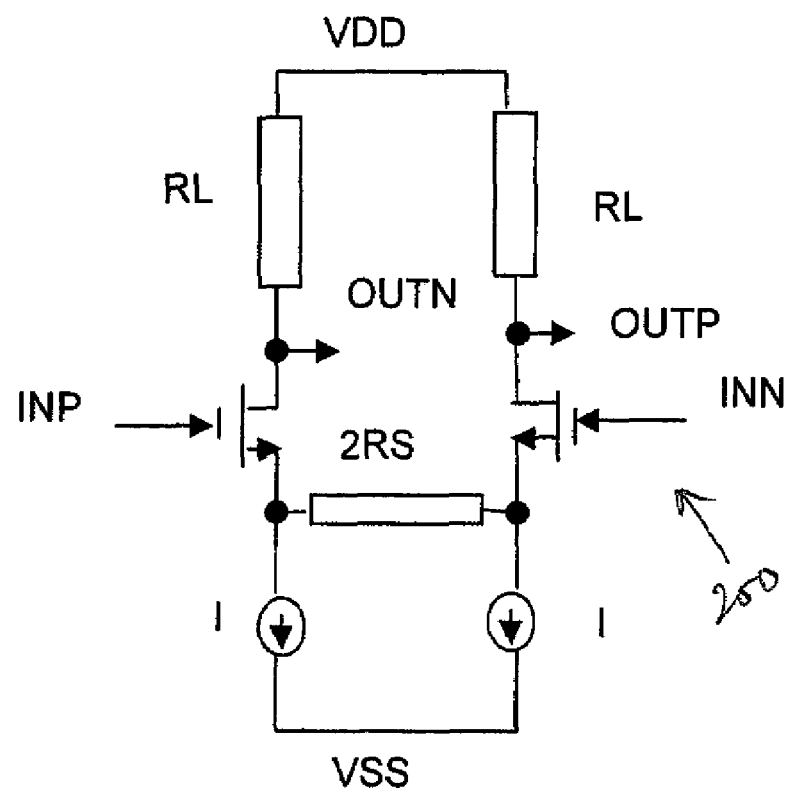
FIG. 2 illustrates differential amplifier 200 suitable for use in each of stages 101, 102 and 103 in LNA 100 of FIG. 1.

FIG. 2 illustrates differential amplifier 200 suitable for use in each of stages 101, 102 and 103 in LNA 100 of FIG. 1. As shown in FIG. 2, as the first-order effect for LNA 100's gain is determined by the resistor ratio RL/RS in each stage, the power is further reduced by reducing $I_3$ and $I_1$ to low levels (but still high enough to permit an acceptable voltage gain). Note that the currents $I_3$ and $I_1$ affect LNA 100's gain by reducing the transconductance (gm) or through other secondary effects.

Thus, methods and apparatus for reducing power dissipation in a low noise amplifier have been described.

The detailed description above is provided to illustrate the specific embodiments of the present invention and is not intended to be limiting. Numerous modifications and variations within the present invention are possible. The present invention is set forth in the following claims.

I claim:

1. A low noise amplifier, comprising:

first, second and third differential amplifiers connected in series each having a terminal for receiving a power supply current; and first and second switches responsive to a control signal, the first and second switches configured such that, (a) when the control signal is in a first state, the first switch and the second switch enable independent currents to flow in the terminals for receiving a power supply current; and (b) otherwise, the first switch and the second switch enable the terminal for receiving a power supply current of the second differential amplifier to reuse a current provided to the terminal for receiving a power supply current of the third differential amplifier.

2. A low noise amplifier as in claim 1, wherein the control signal is provided by a radio frequency noise power detector, which senses an output signal of the low noise amplifier.

3. A low noise amplifier as in claim 2, further comprising a mixer that filters the output signal.

4. A low noise amplifier as in claim 2, further comprising a baseband filter that filters the output signal.

5. A method for providing a low noise amplifier adaptive to interference, comprising:

Connecting first, second and third differential amplifiers in series, each differential amplifier having a terminal for receiving a power supply current; and Controlling first and second switches by a control signal, the first and second switches configured such that, (a) when the control signal is in a first state, the first switch and the second switch enable independent currents to flow in the terminals for receiving a power supply current; and (b) otherwise, the first switch and the second switch enable the terminal for receiving a power supply current of the second differential amplifier to reuse a current provided to the terminal for receiving a power supply current of the third differential amplifier.

6. A method as in claim 5, wherein the control signal is provided by a radio frequency noise power detector, which senses an output signal of the low noise amplifier.

7. A method as in claim 6, further comprising filtering the output signal in a mixer.

8. A method as in claim 6, further comprising filtering the output signal in a baseband filter.

* * * * *